(12) United States Patent
Nakatani et al.

(10) Patent No.: US 7,714,444 B2
(45) Date of Patent: May 11, 2010

(54) CONDUCTIVE RESIN COMPOSITION, CONNECTION METHOD BETWEEN ELECTRODES USING THE SAME, AND ELECTRIC CONNECTION METHOD BETWEEN ELECTRONIC COMPONENT AND CIRCUIT SUBSTRATE USING THE SAME

(75) Inventors: Seiichi Nakatani, Osaka (JP); Seiji Karashima, Osaka (JP); Takashi Kitae, Osaka (JP); Susumu Sawada, Osaka (JP)

(73) Assignee: Panasonic Corporation, Osaka (JP)

( * ) Notice: Subject to any disclaimer, the term of this patent is extended or adjusted under 35 U.S.C. 154(b) by 0 days.

(21) Appl. No.: 12/424,867

(22) Filed: Apr. 16, 2009

(65) Prior Publication Data

US 2009/0200522 A1    Aug. 13, 2009

Related U.S. Application Data

(62) Division of application No. 11/683,612, filed on Mar. 8, 2007, now Pat. No. 7,537,961.

(30) Foreign Application Priority Data

Mar. 17, 2006    (JP)    ............................. 2006-074962

(51) Int. Cl.
*H01L 23/52* (2006.01)
(52) U.S. Cl. ................ 257/772; 257/779; 257/E23.018
(58) Field of Classification Search ................ 257/772, 257/779, E23.018
See application file for complete search history.

(56) References Cited

U.S. PATENT DOCUMENTS

| | | | |
|---|---|---|---|
| 5,145,532 | A | 9/1992 | Fukunaga et al. |
| 2007/0001313 | A1 | 1/2007 | Fujimoto et al. |
| 2008/0017995 | A1* | 1/2008 | Karashima et al. .......... 257/778 |
| 2008/0128664 | A1 | 6/2008 | Kitae et al. |
| 2008/0142966 | A1 | 6/2008 | Hirano et al. |
| 2008/0165518 | A1 | 7/2008 | Ichiryu et al. |
| 2008/0265437 | A1* | 10/2008 | Shiraishi et al. ............. 257/778 |
| 2008/0284046 | A1 | 11/2008 | Karashima et al. |
| 2009/0008800 | A1 | 1/2009 | Nakatani et al. |

FOREIGN PATENT DOCUMENTS

| | | |
|---|---|---|
| JP | 1-157796 | 6/1989 |
| JP | 2000-94179 | 4/2000 |
| JP | 2000-332055 | 11/2000 |
| JP | 2004-260131 | 9/2004 |

* cited by examiner

*Primary Examiner*—Trung Dang
(74) *Attorney, Agent, or Firm*—Hamre, Schumann, Mueller & Larson, P.C.

(57) ABSTRACT

The present invention provides a conductive resin composition for connecting electrodes electrically, in which metal particles are dispersed in a flowing medium, wherein the flowing medium includes a first flowing medium that has relatively high wettability with the metal particles and a second flowing medium that has relatively low wettability with the metal particles, and the first flowing medium and the second flowing medium are dispersed in a state of being incompatible with each other. Thereby, a flip chip packaging method that can be applied to flip chip packaging of LSI and has high productivity and high reliability is provided.

10 Claims, 4 Drawing Sheets

CONDUCTIVE RESIN COMPOSITION, CONNECTION METHOD BETWEEN ELECTRODES USING THE SAME, AND ELECTRIC CONNECTION METHOD BETWEEN ELECTRONIC COMPONENT AND CIRCUIT SUBSTRATE USING THE SAME

This application is a division of U.S. Ser. No. 11/683,612, filed Mar. 8, 2007 which application is incorporated herein by reference.

BACKGROUND OF THE INVENTION

1. Field of the Invention

The present invention relates to a conductive resin composition, a connection method between electrodes using the same, and an electric connection method between an electronic component and a circuit substrate using the same.

2. Description of Related Art

In recent years, due to an increase of density and an increase of integration of a semiconductor integrated circuit (LSI) that is used for electronic equipment, an increase in the number of pins and narrowing of a pitch of an electrode terminal of a LSI chip have proceeded rapidly. For packaging these LSI chips on circuit substrates, flip chip packaging is used widely in order decrease wiring delay. And, in this flip chip packaging, it is common that a solder bump is formed on an electrode terminal of the LSI chip, and is connected to a connection terminal formed on the circuit substrate via the solder bump in one piece.

However, in order to package a next-generation LSI with the number of electrode terminals of more than 5,000 on a circuit substrate, which becomes finer, it is necessary to form a bump that corresponds to a narrow pitch of 100 µm or less, but a current technique for forming a solder bump is difficult to adapt to it.

Moreover, since it is necessary to form a large number of bumps that correspond to the number of the electrode terminals, high productivity by shortening a mounted time of each chip also is required in order to reduce the cost.

Similarly, in the semiconductor integrated circuit, a peripheral electrode terminal is changed into an area-disposed electrode terminal with the increase of the electrode terminals. Moreover, due to the requirements for the increase of the density and the increase of the integration, a semiconductor process is expected to proceed from present 65 nm, and further to 45 nm, 32 nm.

As a result, the wiring becomes more finer, and a capacity between the wirings is increased, so that problems of an increase of a speed and a loss of power consumption become serious, and the demand for a decrease of a dielectric constant (Low-K) of an insulation film between wiring layers is increased further. Since such Low-K of the insulation film is realized by treating an insulation layer material to be porous, a mechanical strength thereof is low, which prevents a decrease of a thickness of the semiconductor.

In addition, when structuring the area-disposed electrode terminal as described above, there is a problem in strength on the porous film due to the Low-K, and since an electrode is needed on an active area of the semiconductor integrated circuit, it is difficult to form the bump on the area-disposed electrode and achieve the flip chip packaging itself. Thus, a low-load flip chip packaging method, which corresponds to the development of the semiconductor process in the future, and is suitable for a semiconductor with a small thickness and a high density, is demanded.

Conventionally, as a technique for forming a bump, a plating method, a screen printing method and the like are developed. The plating method is suitable for a narrow pitch, but requires complicated processes and results in a problem in productivity. On the other hand, the screen printing method has excellent productivity, but is not suitable for narrowing a pitch from the standpoint of using a mask.

In the light of the problems described above, several techniques for forming a solder bump selectively on an electrode of a LSI chip or a circuit substrate have been developed recently. These techniques not only are suitable for forming fine bumps, but also have excellent productivity because of enabling the formation of the bumps in a lump, which attract attention as techniques that can be applied to packaging of the next-generation LSI on the circuit substrate.

For example, in a technique described in Patent Document 1, a solder paste obtained by mixing conductive particles and flux is applied solidly onto a substrate having an electrode formed on a surface thereof, and the substrate is heated, whereby the conductive particles are melted so as to form a solder bump selectively on the electrode with high wettability.

Moreover, in the technique described in Patent Document 2, a paste-type composition (chemical reaction deposition-type solder) that contains an organic acid lead salt and metal tin as main components is applied solidly onto a substrate on which an electrode is formed, and the substrate is heated, whereby a substitution reaction between Pb and Sn is caused so as to deposit an alloy of Pb/Sn on the electrode of the substrate selectively.

By the way, the flip chip packaging using a conventional bump formation technique further requires a step of injecting a resin called an underfill between the semiconductor chip and the circuit substrate so as to fix a semiconductor chip on the circuit substrate, after mounting the semiconductor chip on the semiconductor substrate on which a bump is formed. Thus, after mounting the semiconductor chip on the circuit substrate and melting the solder bump so as to achieve an electric connection, a mechanical strength is low, and it is unstable until the underfill is cured completely.

Then, as a method for achieving an electric connection between the electrode terminals of the semiconductor chip and the circuit substrate that face to each other, and fixing the semiconductor chip onto the circuit substrate at the same time, a flip chip packaging technique (for example, see Patent Document 3) using an anisotropic conductive material is developed. This achieves the electric connection between the electrode terminals of the semiconductor chip and the circuit substrate and the fixation of the semiconductor chip onto the circuit substrate at the same time, by supplying a thermosetting resin containing conductive particles between the circuit substrate and the semiconductor chip so as to apply a pressure onto the semiconductor chip, and heating the thermosetting resin at the same time.

However, in the flip chip packaging using the anisotropic conductive material, since conduction between the facing electrode terminals is obtained by a mechanical contact between the conductive particles that are dispersed uniformly in the resin, the conductive particles that contribute the conduction between the electrode terminals are limited to a part of the conductive particles contained in the resin. Moreover, the reliable electric connection between the conductive material and the facing electrode terminal requires a certain load, and is not suitable for packaging the area-disposed semiconductor integrated circuit using the porous film (Low-K).

Further, since the conductive particles that do not contribute to the conduction between the facing electrode terminals also can be a factor that inhibits insulation between the adjacent electrode terminals, the flip chip packaging using the anisotropic conductive material has numerous problems to be solved in the light of the productivity and the reliability, for being applied to the next-generation LSI chip with the number of connection terminals of more than 5,000.

Further, for the purpose of preventing such conductive particles from being present between the adjacent electrode terminals, a method of melting and integrating solder particles that are dispersed uniformly and collecting them between the electrode terminals is suggested (for example, see Patent Document 4).

According to the present method, by disposing a conductive adhesive between facing terminals such as electrodes and heating it at a temperature that is higher than a melting point of the conductive particles and does not terminate the curing of the resin, the melted conductive particles assume a state of being spread.

Further, the conductive particles that are melted are in a "wetting state" on its terminal surfaces, and further, the conductive particles are arranged so as to be in contact with each other and expanded, so that the terminals are connected electrically.

[Patent Document 1] JP 2000-94179 A
[Patent Document 2] JP 1(1989)-157796 A
[Patent Document 3] JP 2000-332055 A
[Patent Document 4] JP 2004-260131 A However, in the flip chip packaging using the anisotropic conductive material by the integration method of the melted conductive powders described above, by the physical contact of the conductive particles in which the melted conductive powders are dispersed uniformly in the resin, the respective conductive powders are integrated due to the wetting caused by the contact, and obtain the conduction between the facing electrode terminals, and thus, unless a large amount of the conductive particles that contribute to the conduction between the electrode terminals are present in the resin, the conduction cannot be obtained. That is, the melted conductive powders that are dispersed in the resin are required to be present so as to have a probability to be in contact with each other, and redundant conductive powders also are required to be added so as to obtain the conduction between the electrode terminals reliably.

Thus, also in the present method, only a part of the conductive particles contribute to the conduction. Moreover, the conductive particles that do not contribute to the conduction between the facing electrode terminals are present, which can be a factor in inhibiting the insulation between the adjacent electrode terminals.

That is, even the flip chip packaging using the anisotropic conductive material by the integration method of the melted conductive powders has numerous problems to be solved in the light of the reliability, for being applied to the next-generation LSI chip with the number of the connection terminals of more than 5,000.

SUMMARY OF THE INVENTION

Therefore, with the foregoing in mind, it is an object of the present invention to provide a conductive resin composition that can be applied to flip chip packaging of a next-generation LSI and has high productivity and high reliability, a connection method between electrodes using the same, and electric connection method between an electronic component and a circuit substrate using the same.

The conductive resin composition of the present invention is a conductive resin composition for connecting electrodes electrically, in which metal particles are dispersed in a flowing medium, wherein the flowing medium includes a first flowing medium that has relatively high wettability with the metal particles and a second flowing medium that has relatively low wettability with the metal particles, and the first flowing medium and the second flowing medium are dispersed in a state of being incompatible with each other.

The connection method between electrodes of the present invention is an electric connection method between electrodes using a conductive resin composition in which metal particles are dispersed in a flowing medium, the connection method including: preparing the conductive resin composition in which the flowing medium includes a first flowing medium that has relatively high wettability with the metal particles and a second flowing medium that has relatively low wettability with the metal particles, and the first flowing medium and the second flowing medium are dispersed in a state of being incompatible with each other; supplying the conductive resin composition between a plurality of electrodes that are arranged so as to face each other; disposing the first flowing medium in which the metal particles are dispersed between the plurality of the electrodes by utilizing the wettability between the electrodes and the first flowing medium; disposing the second flowing medium in other region; and self-aggregating the metal particles between the electrodes so as to achieve an electric connection selectively.

The connection method between an electronic component and a circuit substrate of the present invention is an electric connection method between an electronic component and a circuit substrate for disposing a semiconductor chip having a plurality of electrode terminals so as to face the circuit substrate having a plurality of connection terminals, and electrically connecting the connection terminal of the circuit substrate and the electrode terminal of the semiconductor chip via a conductive resin composition, the electric connection method including: a first step of supplying the conductive resin composition in which a first flowing medium that has relatively high wettability with the metal particles and a second flowing medium that has relatively low wettability with the metal particles are included, and the first flowing medium and the second flowing medium are dispersed in a state of being incompatible with each other, and disposing the semiconductor chip on the circuit substrate to which the conductive resin composition is supplied so as to face each other at a predetermined gap, at a desired position of the connection terminal of the circuit substrate or the electrode terminal of the semiconductor chip; a second step of holding such that the first flowing medium in which the metal particles are dispersed is formed to be self-aggregated by an interfacial tension between the plurality of the electrode terminals and the plurality of the connection terminals that are arranged so as to face each other, and the second flowing medium is present in a region except for the plurality of the electrode terminals and the plurality of the connection terminals that are arranged so as to face each other, in a stationary state where the semiconductor chip and the circuit substrate face each other; and a third step of curing the conductive resin composition that is supplied between the circuit substrate and the semiconductor chip. The connection terminal of the circuit substrate and the electrode terminal of the semiconductor chip are connected electrically by an aggregation of the metal particles contained in the self-aggregated first flowing medium.

These and other advantages of the present invention will become apparent to those skilled in the art upon reading and understanding the following detailed description with reference to the accompanying figures.

DETAILED DESCRIPTION OF THE INVENTION

Figure 1A:
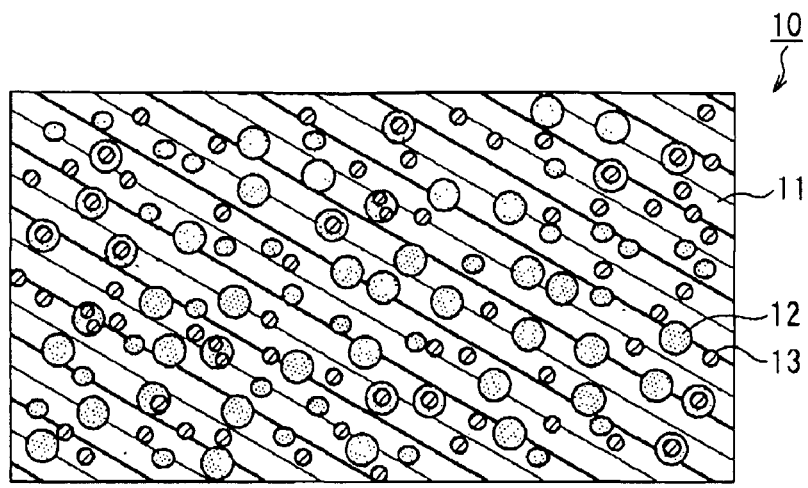
FIGS. 1A to 1C are views explaining states of mixing a conductive resin composition in one example of the present invention in a time series.

According to the present invention, by using a conductive resin composition, an electric connection can be achieved easily and selectively between electrode terminals of a circuit substrate and a circuit substrate, or electrode terminals of a circuit substrate and a semiconductor integrated circuit. By applying the conductive resin composition onto whole regions of connection terminals and the electrode terminals of the circuit substrate and an electronic component to be connected, and arranging the circuit substrates and the electronic components to be connected at a predetermined interval such that the electrode terminals and the connection terminals of the electronic component or the circuit substrate face each other, a first flowing medium containing metal particles is self-aggregated by a surface tension between the predetermined connection terminal and the electrode terminal, and the electric connection can be achieved between the electrode terminal and the connection terminal of the circuit substrates or the electronic component and the circuit substrate by contact of the self-aggregated metal particles. That is, the self-aggregation can be achieved by utilizing the incompatibility between the first flowing medium that has relatively high wettability with the metal particles and the second flowing medium that has relatively low wettability with the metal particles. Thereby, since the metal particles can be aggregated between the desired electrode terminal and the connection terminal, the metal particles are not present in an unnecessary part other than the electrode terminal and the connection terminal, thereby securing excellent insulation reliability.

Moreover, since the electrode terminal and the connection terminal of the circuit substrate or the electronic component have predetermined thicknesses, a gap between the circuit substrate and the electronic component is narrowed between the electrode terminals, and the self-aggregation can be achieved at room temperature by a surface tension of the first flowing medium. Thereby, the self-aggregation of the metal particles can be achieved at a low temperature without utilizing the wettability of the melted metal particles, which is effective from the standpoint of the environmental issue.

Further, by heating so as to melt the metal particles and wetting between the electrode terminal and the connection terminal in the state of self-aggregating them by the surface tension of the first flowing medium at room temperature, an electric connection that has lower resistance and higher reliability can be obtained. Moreover, at the same time, by thermosetting the second flowing medium by heating, the electric connection by the metal particles and sealing between the electronic component and the circuit substrate can be achieved at the same time, thereby realizing the electric connection with high productivity.

The metal particles have relatively high wettability with the first flowing medium and relatively low wettability with the second flowing medium, and thus are moved selectively toward the first flowing medium. Thus, the metal particles that are necessary for the electric connection can be reduced to a minimum. Moreover, the metal particles are not present in an unnecessary part, thereby securing the excellent insulation.

In the present invention, the "wettability" can be measured by forming a foil or a plate of the same material as the metal particles, and measuring a contact angle of each of the flowing media on a surface of the foil or the plate.

Moreover, the "relative" is a term showing whether it is high or low in a relationship between the first flowing medium and the second flowing medium. When the wettability is high, the metal particles are likely to be self-aggregated.

Further, the "flowing medium" is a medium showing a flowing state where the metal particles can be moved when electrically connecting the electrodes by using the conductive resin composition at room temperature (25° C.) or heating it. The present invention provides a connection method between the electrodes by supplying the conductive resin composition, which is a flowing medium, between the plurality of the electrodes that are arranged so as to face each other by a method such as application and printing at room temperature, and a viscosity of the flowing medium for achieving such supplying and a viscosity that does not inhibit the aggregation caused by the wetting of the first flowing medium in which the metal particles are dispersed preferably are 1000 Pa·s (pascal second) or less. Moreover, a viscosity, at which the metal particles that are dispersed in the first flowing medium cannot be dispersed due to sedimentation or the like, is 10 Pa·s or less. Thus, the viscosity of the "flowing medium" of the present invention preferably ranges from 10 Pa·s to 1000 Pa·s.

The present invention can achieve the electric connection between the electrodes effectively and reasonably by using the conductive resin composition in which the first flowing medium and the second flowing medium are dispersed in a state of being incompatible with each other. More specifically, the electric connection can be achieved selectively between the connection terminal and the electrode terminal of the circuit substrate and the circuit substrate or those of the circuit substrate and the semiconductor integrated circuit. The conductive resin composition is applied onto a whole region of the connection terminal of the circuit substrate to be connected, and the electrode terminal and the connection terminal of the electronic component to be connected are arranged so as to face with each other. Thereby, the first flowing medium containing the metal particles is self-aggregated by a surface tension between the predetermined connection terminal and the predetermined electrode terminal. By the contact of the self-aggregated metal particles, the electric connection can be achieved between the electrode terminal and the connection terminal of the circuit substrates or those of the electronic component and the circuit substrate.

It is preferable that, in the conductive resin composition, the first flowing medium, the second flowing medium and the metal particles are dispersed when being mixed, and the metal particles are dispersed in the first flowing medium and the first flowing medium and the second flowing medium are dispersed in a stationary state.

The surface tension of the first flowing medium is preferably higher than the surface tension of the second flowing medium.

It is preferable that the flowing medium of the conductive resin composition is composed of a thermosetting resin, and the metal particles are made of solder, and have a melting point that is lower than a curing temperature of the thermosetting resin.

It is also possible that the first flowing medium of the conductive resin composition is composed of a thermoplastic resin, and the second flowing medium is composed of a thermosetting resin.

It is also possible that the first flowing medium of the conductive resin composition is composed of a thermosetting resin, and the second flowing medium is composed of a photocurable resin.

It is preferable that the conductive resin composition is supplied between an electronic component and the circuit substrate which respectively have a plurality of electrodes that are arranged so as to face each other, the first flowing medium in which the metal particles are dispersed is present between the plurality of the electrode terminals and the plurality of the connection terminals that are arranged so as to face each other, and the second flowing medium is present in other region.

It is preferable that the conductive resin composition is present with the melted metal particles in the first flowing medium between the plurality of the electrode terminals and the plurality of the connection terminals that are arranged so as to face each other between the electronic component and the circuit substrate, and the electric connection is achieved between the plurality of the electrode terminals and the plurality of the connection terminals.

In the electric connection method of the present invention, it is preferable to form an organic layer for decreasing the wettability of a part except for a part between the electrodes. The organic layer for decreasing the wettability may be a water-repellent or oil-repellent organic layer made of, for example, a silicone-acrylic copolymer or a fluorine-acrylic copolymer. Further, it is preferable that the electronic component and/or the circuit substrate respectively have the plurality of the electrode terminals and the plurality of connection terminals that are arranged so as to face each other, a first region and a second region that has high wettability with the flowing medium than the first region are present on a main surface of the electronic component or the circuit substrate, and the organic layer for decreasing the wettability is present in the first region. Moreover, the second region that has the high wettability with the flowing medium than the first region may be the plurality of the electrode terminals and the plurality of the connection terminals, which are arranged so as to face each other, of the electronic component and/or the circuit substrate.

In the present invention, the electronic component preferably is a semiconductor device that has a plurality of electrode terminals. Moreover, the electronic component preferably is composed of a circuit substrate that is constituted of a plurality of wiring patterns and a plurality of electrode terminals.

Moreover, the flowing medium is a liquid, and a solvent that can be dissolved only in the first flowing medium or the second flowing medium may be added thereto.

Moreover, it is preferable that the metal particles are in contact with each other such that the aggregation of the metal particles composes the conductive resin composition.

Moreover, between the second step and the third step, a step of heating the conductive resin composition containing the aggregation of the metal particles that are self-aggregated between the connection terminal of the circuit substrate and the electrode terminal of the semiconductor chip so as to melt the metal particles that are contained in the first flowing medium further may be included.

The first step preferably includes, after supplying the conductive resin composition on the circuit substrate, arranging the semiconductor chip so as to face the circuit substrate such that the connection terminal of the circuit substrate and the electrode terminal of the semiconductor chip have a desired gap. In the first step, the surface of the circuit substrate except for the electrodes preferably is subjected to water-repellent treatment or oil-repellent treatment in advance.

A content of the metal particles, the first flowing medium and the second flowing medium preferably is within a range of the metal particles: 4 wt % to 40 wt %; the first flowing medium: 10 wt % to 20 wt %; and the second flowing medium: 40 wt % to 76 wt %.

The electric connection method of the present invention is suitably applied to flip chip packaging of an LSI chip on a circuit substrate and packaging of the circuit substrates, and in the case where the metal fine particles are 4 wt % or more, when they are dispersed in the first flowing medium and are self-aggregated, the contact of the metal fine particles with each other becomes sufficient, and a secure electric connection can be obtained. Moreover, in the case where the metal fine particles are 40 wt % or less, they may be present substantially only in the first flowing medium, and are not present or only marginally present in an unnecessary part, thereby obtaining the electric insulation. Because of the similar reason, the first flowing medium is set so as to be self-aggregated in an electrically connected part, and thus the range between 10 wt % to 20 wt % is preferable.

Arbitrary solder particles may be selected to be used. For example, solder particles listed in Table 1 below can be exemplified. Materials shown in Table 1 can be used alone or in combination as appropriate.

TABLE 1

| composition of solder particle | melting point (solidus curve) (° C.) |
|---|---|
| Sn—58Bi | 139 |
| Sn—37Pb | 183 |
| Sn—9Zn | 199 |
| Sn—3.0Ag—0.5Cu | 217 |
| Sn—3.5Ag | 221 |
| Sn—0.7Cu | 228 |
| 12Sn—2.0Ag—10Sb—Pb | 240 |

The melting point of the solder particles preferably ranges from 100° C. to 300° C., and more preferably ranges from 139° C. to 240° C. as shown in Table 1. If the melting point is less than 100° C., a problem tends to occur in durability. If the melting point is more than 300° C., the selection of the resin becomes difficult.

An average volume particle diameter of the solder particles preferably ranges from 1 μm to 30 μm, and more preferably ranges from 5 μm to 20 μm. If the average volume particle diameter is less than 1 μm, the melting of the solder particles becomes difficult due to surface oxidation, and it tends to take a significantly long period of time to form an electric connector. If the average volume particle diameter is more than 30 μm, it becomes difficult to obtain the electric connector due to sedimentation. Herein, the average volume particle diameter can be measured by using a commercially available particle size distribution meter. For example, the measurement can be carried out by using a laser diffraction particle size meter produced by HORIBA, Ltd. (product name: "LA920"), a laser diffraction particle size meter produced by Shimadzu Corporation. (product name: "SALD2100") or the like.

An embodiment of the present invention will be described below with reference to drawings. In the drawings described below, the components having substantially the same functions are denoted by the same reference numerals so as to simplify their explanations. Moreover, the present invention will not be limited to the below embodiment.

Figure 1B:
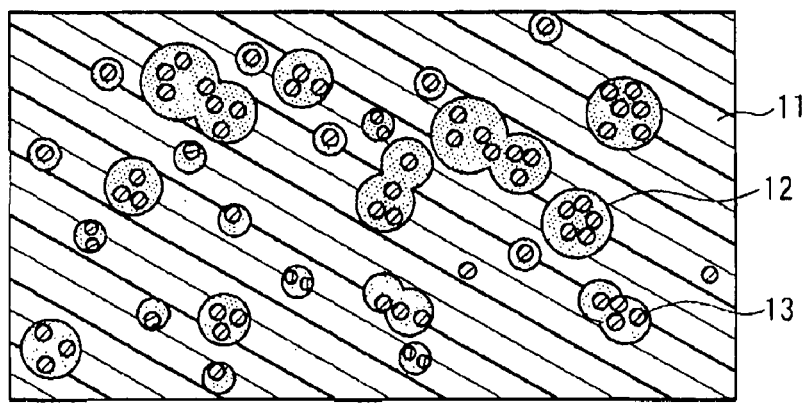
Figure 1C:
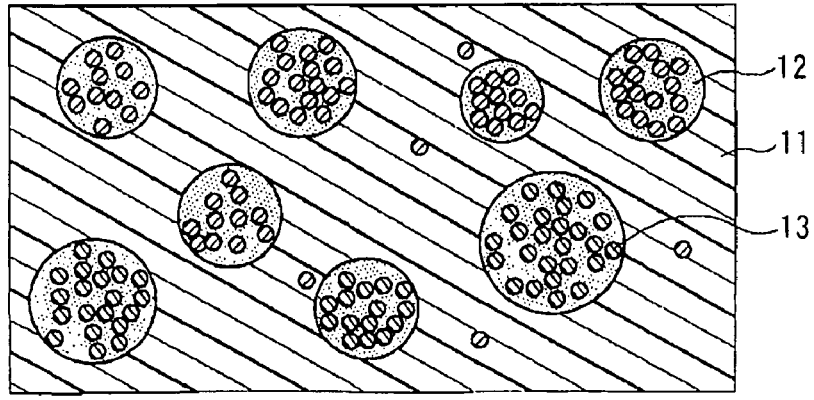

FIGS. 1A to 1C are cross-sectional views showing a structure of the conductive resin composition according to the embodiment of the present invention.

Firstly, as shown in FIG. 1A, a conductive resin composition 10 of the present invention is present in a flowing medium in a state where metal particles 13 are dispersed. The flowing medium is composed of a first flowing medium 12 that has high wettability with the metal particles 13 and a second flowing medium 11 that has low wettability with the metal particles 13. Due to sufficient dispersion of each of the components that compose the conductive resin composition 10, the flowing media 12 and 11 are dispersed without being dissolved, and the metal particles 13 are present in a state where a part of the metal particles 13 are wetted with the second flowing medium 12. In this state, the first flowing medium and the second flowing medium that contain the metal particles are mixed, and the first flowing medium 12 and the second flowing medium 11 are separated after a lapse of a predetermined time because they are incompatible with each other. At this time, the first flowing medium 12 that has the high wettability includes a relatively large amount of the metal particles 13, and the second flowing medium 11 that has the low wettability includes relatively less metal particles 13. As described above, the wettability of the flowing media with the metal particles 13 is measured.

FIGS. 1B and 1C show a change in time series of the conductive resin composition 10 in such a condition in a stationary state, after being dropped onto a substrate or the like. FIG. 1C shows a state of the conductive resin composition 10 that is allowed to be in the stationary state and then is let stand for a sufficient period of time, and FIG. 1B shows a state after a lapse of time (for example, after about 20 seconds from the time when letting the conductive resin composition 10 stand).

In FIG. 1B, a large part of the metal particles 13 are taken into the first flowing medium 12 that has the excellent wettability, and only a small amount of the metal particles 13 are present in the second flowing medium 11. Moreover, since the first flowing medium 12 and the second flowing medium 11 are not dissolved with each other, they are separated completely, and the first flowing medium 12 becomes wet and aggregated sequentially. Subsequently, after letting it stand for a sufficiently long period of time (for example, after about 1 minute from the time of starting to let it stand), as shown in FIG. 1C, the first flowing medium 12 in which the metal particles 13 are complemented with wettability is enlarged in size extremely, and assumes a state where a bubble-shaped aggregation that contains the metal particles 13 and is independent in the second flowing medium 11 is dispersed.

As the metal particles, high melting point metal powders such as copper, silver and gold, low melting point metal powders such as tin, indium, bismuth and zinc, and alloy powders of them can be used. Particularly, solder particles exemplified in Table 1 described above are preferable. Powders that are subjected to surface treatment for securing the wettability with the first flowing medium can be used. As the surface treatment, for example, water-repellent treatment, hydrophilizing treatment and the like can be used. Further, it is preferable that a content of the metal particles ranges from 4 wt % to 40 wt %, a content of the first flowing medium ranges from 10 wt % to 20 wt %, and the second flowing medium ranges from 40 wt % to 76 wt %. According to such contents, more metal particles than those required for aggregating in the first flowing medium due to the wettability and obtaining an electric connection due to the aggregation in the first flowing medium are not necessary.

Moreover, as the first flowing medium, a thermosetting resin that is a liquid before the use and is cured by heat, a thermoplastic resin that is softened or melted in a state of being heated, an organic solvent that is a liquid at room temperature and the like can be used. As the thermosetting resin, an epoxy resin, an acrylic resin, a silicone resin, polyimide and the like can be used. As the thermoplastic resin, polyvinylbutyral (a butyral resin), polybutadiene and the like can be used. As the organic solvent, alcohols such as ethanol, butanol and glycerin, ketones and the like can be used.

Whereas, as the second flowing medium, various kinds of resins that are not dissolved in the first flowing medium, and organic solvents can be used. For example, an epoxy resin, polyimide and the like that are thermosetting resins can be used.

A content ratio of the first flowing medium 12 and the second flowing medium 11 varies according to a size and the number of the connection terminals 15 of the circuit substrate 14 that are electrically connected, but it is preferable that, when the conductive resin composition is assumed to be 100 wt %, the first flowing medium 12 ranges from 10 wt % to 20 wt %, and the second flowing medium 11 ranges from 40 wt % to 76 wt %.

Moreover, it is preferable that a surface tension of the first flowing medium 12 is higher than a surface tension of the second flowing medium 11, and the self-aggregation can be achieved between the connection terminal 15 and the electrode terminal 15 of the circuit substrate 14 and a semiconductor chip 16 with priority, according to the surface tension of the first flowing medium 12.

FIGS. 2A to 2E are cross-sectional views showing basic steps of a flip chip packaging method as one example of the present invention.

Figure 2A:
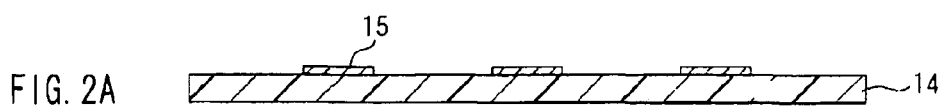
FIGS. 2A to 2E are cross-sectional views showing steps of a flip chip packaging method using a conductive resin composition in one example of the present invention.
Figure 2B:
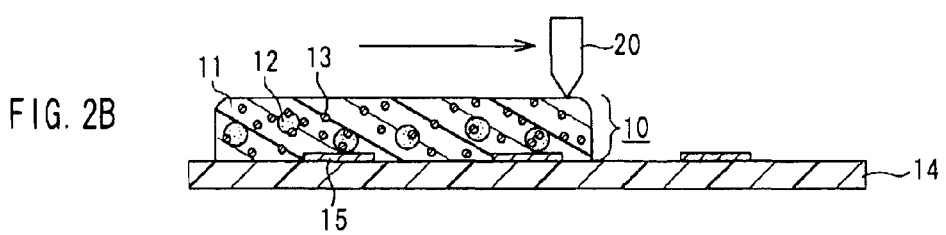

Firstly, as shown in FIG. 2A, a substrate (a circuit substrate) 14 having a plurality of the connection terminals 15 is provided. Other than the connection terminals 15, a wiring pattern is provided, which is not illustrated in FIG. 2A. Next, as shown in FIG. 2B, in a desired region of the connection terminal 15 on a surface of the circuit substrate 14, the conductive resin composition 10 including the first flowing medium 12 and the second flowing medium 11 that contain the metal particles 13 is supplied by using a dispenser 20.

Herein, the metal particles 13 are dispersed uniformly in the conductive resin composition 10, and it is preferable that the conductive resin composition 10 is mixed to be uniform sufficiently in the dispenser 20, and has a viscosity having flowability at room temperature.

Figure 2C:
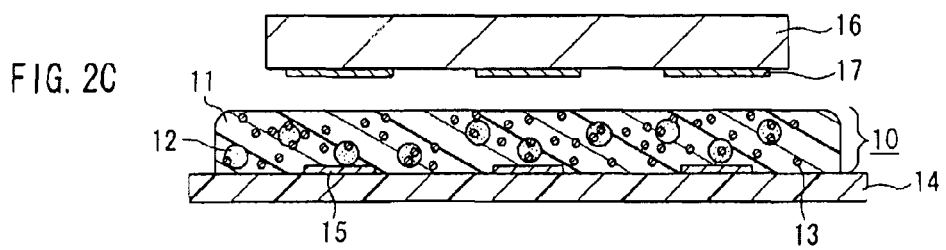

Next, as shown in FIG. 2C, the connection terminal 15 of the substrate 14 and the electrode terminal 12 of the semiconductor chip 16 are fixed so as to face each other and maintain a constant gap. At this time, the conductive resin composition 10 on the connection terminal 15 of the substrate 14 is extruded slightly, whereby the gap between the semiconductor chip 16 and the circuit substrate 14 is filled with the conductive resin composition 10.

Incidentally, the connection terminal 15 of the substrate 14 and the electrode terminal 17 of the semiconductor chip 16 are not in contact directly with each other, and the conductive resin composition 10 remains between the facing terminals.

Moreover, the conductive resin composition 10 may be supplied so as to fill in the gap between the semiconductor chip 16 and the substrate 14, after disposing the terminals 15 and 17 so as to face each other.

Figure 2D:
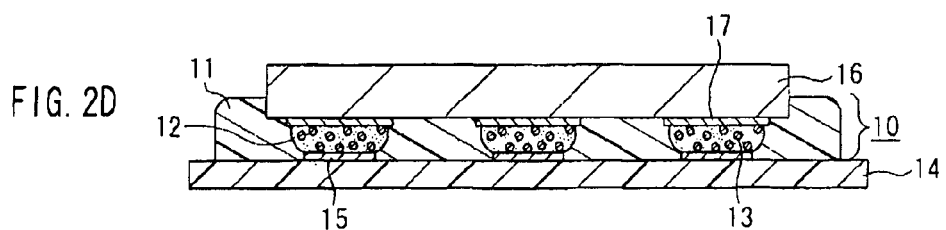

From this state, as shown in FIG. 2D, in the conductive resin composition 10 that is present in the gap between the semiconductor chip 16 and the circuit substrate 14, similarly to the behavior from FIG. 1A to FIG. 1C, the first flowing medium 12 that contains the metal particles 13 with the wettability aggregates gradually, is separated from the second flowing medium 11, and aggregates at a protruding portion of the connection terminal 15 of the circuit substrate 14 by the interfacial tension. The metal particles 13 that are dispersed in the first flowing medium 12 can obtain an electric connection due to the aggregation of the metal particles in the first flowing medium.

Figure 2E:
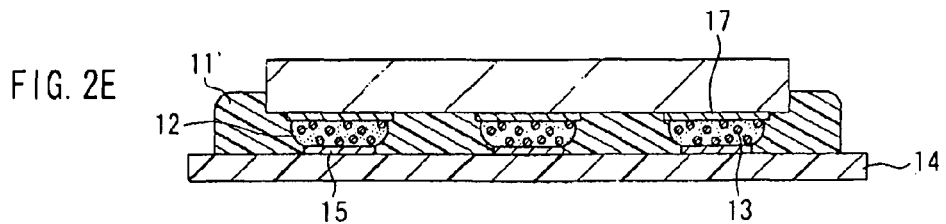

Further, as shown in FIG. 2E, by curing or solidifying the first flowing medium and the second flowing medium by heating, the electric connection by the metal particles 13 and sealing between the semiconductor 16 and the circuit substrate 14 can be achieved at the same time. Reference numeral 11' denotes an insulating resin that is solidified or cured.

Moreover, by melting the metal particles 13 by heating after the step shown in FIG. 2D, an electric connection that has further lower resistance and is secure can be obtained.

Next, FIGS. 3A to 3F are cross-sectional views showing basic steps of a flip chip packaging method as one example of the present invention.

Figure 3A:
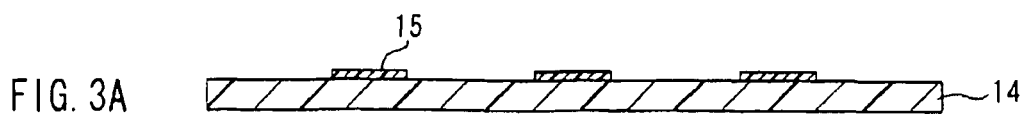
FIGS. 3A to 3F are cross-sectional views showing steps of a flip chip packaging method in one example of the present invention.
Figure 3B:
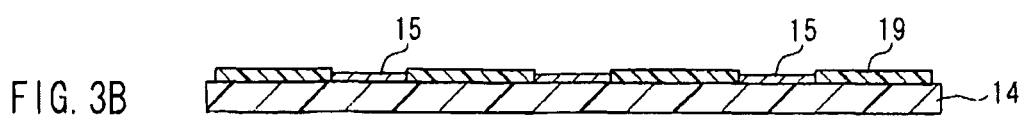

Firstly, as shown in FIG. 3A, the substrate (the circuit substrate) 14 that has a plurality of the connection terminals 15 is provided. Other than the connection terminals 15, a wiring pattern is provided, although members other than the connection terminals 15 are not illustrated in FIG. 3A. Next, FIG. 3B is a view showing a step of applying water-repellent treatment at a desired position on the circuit substrate 14. For example, the water-repellent treatment is achieved on a surface of the substrate 14, by applying a resist on the surface.

Next, by leaving a region that serves as the connection terminals 15, the resist is patterned, a water-repellent film (for example, product name of "EGC-1700 electronic coating agent"; produced by Sumitomo 3M Limited) subsequently is applied onto a surface of the substrate 14 while using the resist as a mask, and thereafter, the resist is lifted off.

Figure 3C:
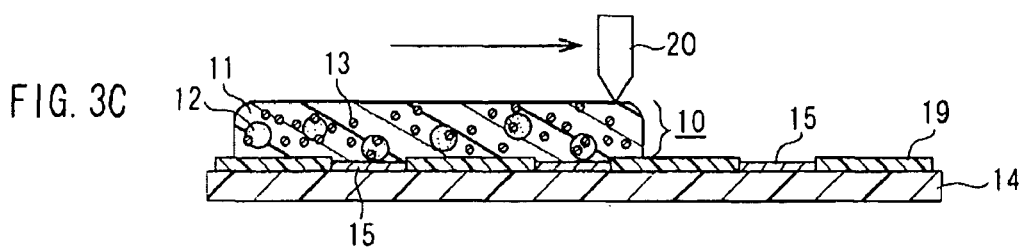

As a result, as shown in FIG. 3C, an organic film (a water-repellent film) 19 having water repellency remains on the surface of the substrate 14 except for the connection terminals 15, and an interfacial tension between the surface and the first flowing medium 12 containing the metal particles 13 can be decreased.

On the circuit substrate 14 on which a water-repellent organic film 19 is formed as described above, the conductive resin composition 10 is supplied by using the dispenser 20, similarly to the case of FIG. 2.

Figure 3D:
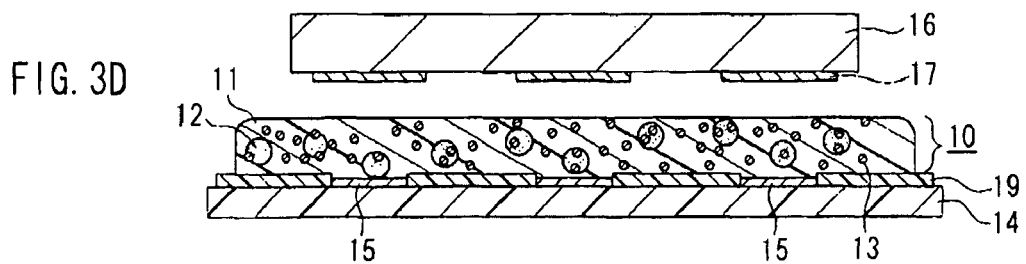

Next, as shown in FIG. 3D, the connection terminal 15 of the substrate 14 on which the water-repellent organic film 19 is formed and the electrode terminal 12 of the semiconductor chip 16 are fixed so as to face each other and maintain a constant gap. At this time, the conductive resin composition 10 on the connection terminal 15 of the substrate 14 is extruded slightly, and as a result, the gap between the semiconductor chip 16 and the circuit substrate 14 is filled with the conductive resin composition 10.

Figure 3E:
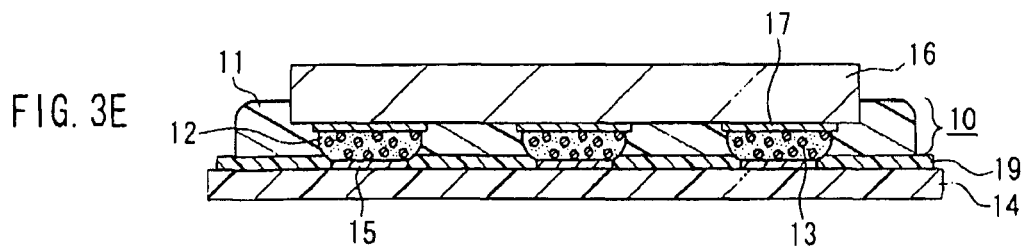

From this state, as shown in FIG. 3E, in the conductive resin composition 10 that is present in the gap between the semiconductor chip 16 and the circuit substrate 14, similarly to the behavior from FIG. 1A to FIG. 1C, the first flowing medium 12 that contains the metal particles 13 with high wettability aggregates gradually, is separated from the second flowing medium 11, is not wetted with the water-repellent organic film 19 that is formed on the circuit substrate 14 except for the connection terminals, and as a result, aggregates at the connection terminals 15 by the interfacial tension. The metal particles 13 that are dispersed in the first flowing medium 12 can obtain an electric connection due to the aggregation of the metal particles in the first flowing medium.

Figure 3F:
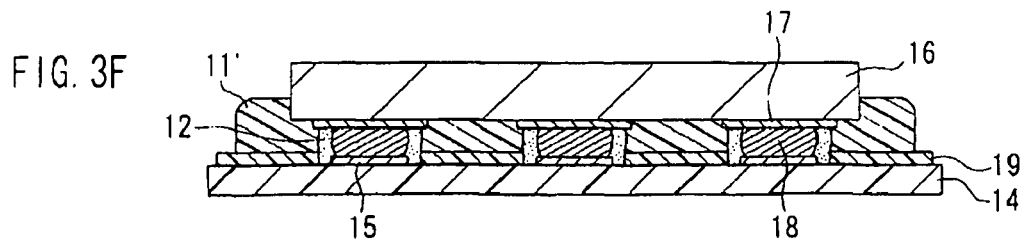

Further, as shown in FIG. 3F, by curing or solidifying the first flowing medium and the second flowing medium by heating, the electric connection by the metal particles 13 and sealing between the semiconductor 16 and the circuit substrate 14 due to the solidification of the flowing medium can be achieved at the same time. Reference numeral 11' denotes an insulating resin that is solidified or cured.

Moreover, the metal particles 13 are melted by heating similarly, and the electric connection can be obtained. In the case of obtaining the electric connection by melting the metal particles 13, the first flowing medium of the flowing media may be water, and the second flowing medium thereof may be a solvent.

The reason for this is because water and a solvent that are present between the circuit substrate 14 and the semiconductor chip 16 are washed out and removed, and thereafter, a sealing resin is supplied newly and is cured, whereby the sealing resin with higher reliability can be selected. A similar effect can be obtained, if the first flowing medium of the flowing media is oil and the second flowing medium thereof is water.

As described above, in the conductive resin composition of the present invention that is supplied into the gap between the semiconductor chip 16 and the circuit substrate 14, the aggregation of the metal particles 13 that are self-aggregated by the interfacial tension between the facing terminals by the effect of the first flowing medium 12 and the second flowing medium 11 that contain the metal particles 13, and are contained with the wettability in the self-aggregated first flowing medium 12 can form a connector that can provide the electrical connection between the connection terminal and the electrode terminal selectively.

Thus, the metal particles 13 contained in the conductive resin composition 10 can be utilized effectively. Moreover, since the first flowing medium 12 containing the metal particles 13 is not present between the adjacent terminals, the insulation between the adjacent terminals can be increased, and a flip chip package with high reliability can be realized.

Further, since the connector (the first flowing medium 12 containing the metal particles 13) for electrically connecting the connection terminal 15 and the electrode terminal 17 can be formed with self-aggregation, it can be applied also to narrow-pitched flip chip packaging of the next-generation LSI.

In addition, by self-aggregating the first flowing medium 12 that contains the metal particles 13 between the connection terminal 15 and the electrode terminal 17, and curing the self-aggregated first flowing medium 12 and the second flowing medium 11 at the same time, the electric connection can be achieved between the connection terminal 15 and the electrode terminal 17 of the semiconductor chip 16 and the substrate 14, and the semiconductor chip 16 and the substrate 14 are fixed with the cured flowing medium 11' at the same time, thereby realizing the flip chip package with high productivity.

Figure 4:
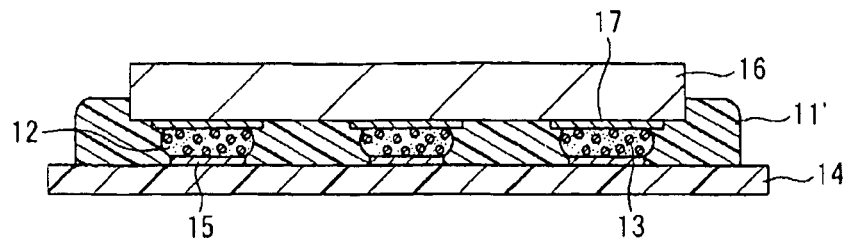
FIG. 4 is a cross-sectional view showing a structure of a flip chip package obtained in one example of the present invention.

FIG. 4 is an enlarged cross-sectional view of the semiconductor chip 16 packaged on the circuit substrate 14 that is obtained by the steps of FIGS. 2A to 2E. The cross-sectional view shows a state where the first flowing medium 12 containing the metal particles 13 is self-aggregated between the connection terminal 15 of the circuit substrate 14 and the electrode terminal 17 of the semiconductor chip 16, the circuit substrate 14 and the semiconductor chip 16 are fixed with the first flowing medium 12 and the second flowing medium 11, and further, the connection terminal and the electrode terminal 17 are connected electrically by the metal particles 13 that are aggregated in the first flowing medium 12.

Figure 5:
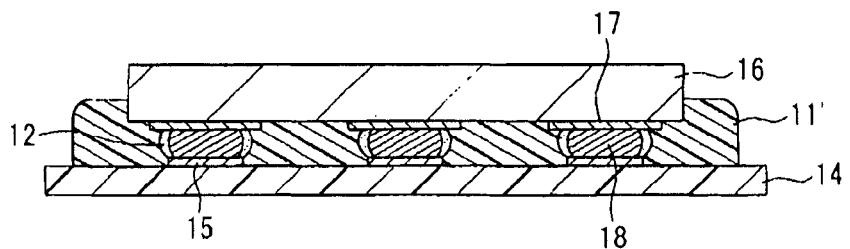
FIG. 5 is a cross-sectional view showing a structure of a flip chip package obtained in one example of the present invention.

Similarly, FIG. 5 is a cross-sectional view showing a state where the metal particles 13 in the first flowing medium 12 are melted, and the connection terminal 15 and the electrode terminal 17 are metal-connected by a melted metal 18.

Figure 6:
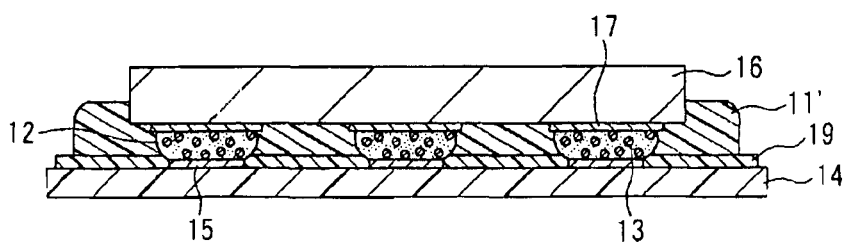
FIG. 6 is a cross-sectional view showing a structure of a flip chip package obtained in one example of the present invention.

Moreover, FIG. 6 shows a state where the water-repellent organic film 19 that is a water-repellent film having water repellency is formed at a desired position on the circuit substrate 14, the first flowing medium 12 is self-aggregated on the part of the connection terminal 15 of the circuit substrate 14 except for the water-repellent organic film 19, and the electric connection is obtained by the metal particles 13 that are aggregated in the self-aggregated first flowing medium 12.

Figure 7:
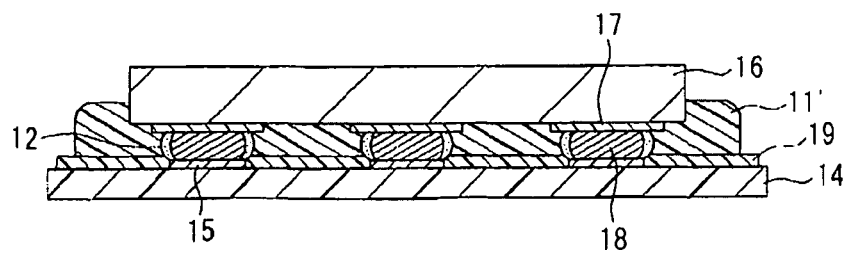
FIG. 7 is a cross-sectional view showing a structure of a flip chip package obtained in one example of the present invention.

Similarly, FIG. 7 is a cross-sectional view showing a state where the metal particles 13 in the first flowing medium 12 are melted, and the connection terminal 15 and the electrode terminal 17 are metal-connected by the melted metal 18.

According to the structure of the present invention, in the first flowing medium containing the metal particles 13, by applying the water-repellent organic film 19 (water-repellent treatment) onto the surface of the substrate 14 (or the semiconductor chip 16) in advance, the self-aggregation of the first flowing medium 12 between the terminals can be carried out smoothly.

Example 1

An example shown in FIGS. 2A to 2E will be described below specifically. As the circuit substrate 14 of FIG. 2A, a four-layer wiring glass epoxy resin substrate (produced by Panasonic Electronic Devices Co., Ltd., ALIVH, registered trademark) was used, and a semiconductor chip (a silicon memory semiconductor, thickness: 0.3 mm, length: 10 mm, width: 10 mm, having the electrode terminal 15 equivalent to the circuit substrate 14) was packaged on a wiring layer (diameter: 50 μm, pitch: 100 μm, 352 terminals on its periphery) serving as the connection terminal 15 on a part of a wiring pattern of a surface layer made of a copper foil. Incidentally, on the connection terminal 15 and the wiring pattern (not illustrated) of the circuit substrate 14, nickel was applied, and gold plating was applied further thereon.

Subsequently, as shown in FIG. 2B, the conductive resin composition 10 of the present invention was supplied by using the dispenser 20. As the metal particles 13 of the conductive resin composition, solder (produced by Senju Metal Industry Co., Ltd., Sn-3.0 Ag-0.5 Cu, melting point: 217° C.) was used. An average volume particle diameter of solder particles was 12 μm, which was measured by using a particle size distribution meter.

Moreover, as the first flowing medium 12, an epoxy resin (produced by SANYU REC CO. LTD., a liquid epoxy resin GRS-811) was used, and as the second flowing medium 11, a silicone resin (produced by Shin-Etsu Chemical Co., Ltd, curable liquid silicone KR285) was used. A content ratio will be described below.

a) metal particle 13: solder powder (Sn-3 Ag-0.5 Cu) 15 wt % b) first flowing medium 12: epoxy resin 15 wt % c) second flowing medium 11: silicone resin 70 wt %

The above-described materials were mixed while being stirred by using a kneader. The conductive resin composition manufactured by mixing was put into the dispenser 20, and was applied on a packaging part of the semiconductor chip 16 of the circuit substrate 14. At this time, the dispenser 20 that has a function of stirring was used such that the respective materials were not separated. The conductive resin composition was supplied while being controlled to have a constant thickness of about 40 μm.

At this time, the conductive resin composition may be supplied so as to scan the region on which the semiconductor chip 16 was packaged in order to apply it on the whole region uniformly, or may be dispensed in an appropriate shape such as a letter and a mark.

In the state where the conductive resin composition 10 was supplied on the circuit substrate 14 as described above, the semiconductor chip 16 was positioned swiftly and was held so as to provide a predetermined gap (thickness: 30 μm) (FIG. 2C).

The conductive resin composition 10 that was supplied at this time was in contact with the surface of the semiconductor chip 16, and an excess of the conductive resin composition 10 was squeezed out from the semiconductor chip 16.

By maintaining this state for about 10 seconds, the first flowing medium 12 and the second flowing medium 11 in the conductive resin composition 10 were separated, and the metal particles 13 having excellent wettability came to be contained in the first flowing medium 12. Further, after a lapse of about 10 seconds, the first flowing medium 12 containing the metal particles 13 aggregated slowly, and aggregated at the electrode that protruded on the circuit substrate 14, that is, the connection terminal 15 (FIG. 2D).

Further, as shown in FIG. 2E, by heating (170° C.) the whole of the circuit substrate 14, the semiconductor chip 16 and the conductive resin composition 10 and maintaining as they were (30 seconds), the first flowing medium 12 and the second flowing medium 11 were cured by the heat. Then, the metal particles 13 in the first flowing medium 12 aggregated between the connection terminal 15 and the electrode terminal 17, thereby achieving an electric connection. At the same time, by the curing of the first and second flowing media, the sealing between the circuit substrate 14 and the semiconductor chip 16 could be achieved.

Moreover, by reheating (230° C.) those whose electric connection and sealing were completed, the solder that was the aggregated metal particles 13 was melted, thereby achieving a connection with further decreased resistance (FIG. 5).

In the package manufactured thereby, a fixed portion of the circuit substrate 14 and the semiconductor chip 16 was flexible, and had a function to relax a stress that was caused by a thermal shock or the like, thereby providing high reliability. Moreover, since the electric connection was achieved by metal connection by melting of solder, a strong connecting condition could be maintained.

Further, since the epoxy resin that was the first flowing medium was cured on a melted solder-side surface, and functions to relax the thermal stress that was applied to the solder and suppress plastic deformation that was applied to the solder, the package with exceedingly high reliability could be obtained.

Example 2

An example shown in FIGS. 3A to 3F will be described below specifically. The circuit substrate 14 and the semiconductor chip 16 used in the present example were similar to those used in Example 1.

Firstly, in a region on the circuit substrate 14 except for the part of the connection terminal 15, the water-repellent organic film 19 that had low wettability with the first flowing medium 12 was formed. More specifically, a photosensitive water-repellent resist was used as the water-repellent organic film 19.

The photosensitive water-repellent resist (produced by NIPPON PAINT Co., Ltd, a silicone-acrylic block copolymer) was a photocurable water-repellent material, and had a microphase-separated structure that was constituted of a "sea" composed of an acrylic chain and a crosslinking agent (isocyanate, melamine or the like) and an "island" composed of a silicone chain. According to this "sea and island" structure of the silicone resin that exhibited the water repellency, the water repellency could be exhibited.

The specific method for forming the water-repellent organic film 19 included: dropping the photosensitive water-repellent resist onto the circuit substrate 14; applying it by spin coating so as to provide a film thickness of 1.5 μm; and prebaking by heat treatment at 120° C. for 30 minutes.

Thereafter, it was exposed to UV by using a photomask so as to provide a pattern that was inverse to that of the above-described connection terminal 15. An exposure value was 300 mj/cm$^2$ (wavelength of 350 nm), and it was prebaked again at 120° C. for 30 minutes.

Subsequently, a part (region of the connection terminal 15) that was not exposed was removed by development with diethyleneglycolmethylether, and only a part to be provided with the water repellency was left. This was subjected to heat treatment at 120° C. for 10 minutes, thereby being cured completely (FIG. 3B).

On the circuit substrate 14 on which the thus manufactured water-repellent organic film 19 is formed, the conductive resin composition 10 as described below was applied to a desired position by using the dispenser 20.
  a) metal particle: produced by MITSUI MINING & SMELTING CO., LTD. (Sn powder, average particle diameter: 2 μm); 10 wt %
  b) first flowing medium: pure water; 15 wt %
  c) second flowing medium: (epoxy resin 70 wt %+toluene 30 wt %); 75 wt %

The conductive resin composition 10 obtained by mixing the above-described materials was applied by using the dispenser 20 as shown in FIG. 3C, the semiconductor chip 16 was disposed similarly to Example 1, and the first flowing medium 12 containing the metal particles 13 was self-aggregated between the connection terminal 15 and the electrode terminal 17 over a course of time. In a mechanism in which the first flowing medium (pure water) was self-aggregated, the first flowing medium was water, the second flowing medium was a liquid epoxy resin in which toluene was dissolved, and the first and second flowing media were not dissolved with each other and thus were separated over a course of time. At this time, since the metal particles (Sn) were subjected to surface treatment for obtaining a hydroxyl group on a surface thereof so as to have excellent wettability with water, the Sn powders were taken into the pure water easily. Moreover, since the water-repellent organic film 19 as the organic film was formed on the circuit substrate 14 as described above, the pure water that was the separated first flowing medium was not wetted with the water-repellent organic film 19, and was self-aggregated at the connection terminal 15 on which the water-repellent organic film 19 was not present (FIG. 3E).

In the pure water that was the self-aggregated first flowing medium, the Sn powders as the metal particles were aggregated. The thus self-aggregated package was volatilized by being maintained at 100° C., which is a temperature for volatizing the pure water and the toluene that was dissolved in the epoxy resin, for 30 minutes.

Further, it was maintained at 200° C. for 60 seconds so as to cure the epoxy resin that was the second flowing medium, thereby fixing the circuit substrate 14 and the semiconductor chip 16. Further, by heating at 250° C. for 20 minutes, the aggregated Sn powders were melted so as to connect between the connection terminal 15 and the electrode terminal 17 of the semiconductor chip.

Thereby, the fixing between the circuit substrate 14 and the semiconductor chip 16, and the electric connection between the connection terminal 15 and the electrode terminal 17 could be achieved at the same time.

Herein, the flowing media and the metal particles of the conductive resin composition that are used in the flip chip packaging method of the present invention are not limited particularly, but materials described below can be used, respectively.

As the flowing medium, as described above, a thermosetting resin such as an epoxy resin, a phenol resin and a silicone resin, a thermoplastic resin such as a fluorocarbon resin, a polyimide resin and a polyamide resin, a photocurable (ultraviolet-curable) resin, and materials obtained by combining them can be used, but it is preferable to have a viscosity having flowability at room temperature.

Further, it is possible that the first flowing medium is oil, and the second flowing medium is pure water. The reason for this is because the first flowing medium and the second flowing medium are not dissolved with each other, a surface tension of the first flowing medium is high, and the first flowing medium has excellent wettability with the metal particles. The oil and the water are separated after a lapse of time from being mixed, the metal particles may be present in the oil, and an oil-repellent film is formed further on the circuit substrate, whereby the oil containing the metal particles can be self-aggregated on the connection terminal.

Moreover, as the metal particles, a solder alloy of a Sn—Bi system, a Sn—Pb system, a Sn—Ag system or the like, and a metal such as Cu, Ag and AgCu can be used. Incidentally, in the present invention, in order to obtain the electric connection between the terminals by the contact of the conductive particles with each other, it is preferable to suppress the growth of the oxidation film on the surfaces of the conductive particles to be minimum. Moreover, it also may be in a state where only the surfaces of the conductive particles that are in contact with each other are melted, and a metal bond is formed on each of interfaces therebetween.

Further, the conductive resin composition may contain inorganic (for example, silica, alumina and the like) powders for controlling thermal expansion, thermal conduction and a dielectric constant in the sealing resin, besides the above-described contents.

Moreover, as the organic layer as the water-repellent film, a water-repellent film such as a silicone film, a silicone-acrylic copolymer and a fluorine-acrylic copolymer may be used. The water-repellent film preferably has a contact angle with water of 90° or more, and a contact angle with a solvent such as toluene of 50° or less, for example.

In the flip chip packaging method described above, it also is possible that the substrate 14 is constituted of the circuit substrate, and a plurality of the semiconductor chips 16 are subjected to the flip chip packaging on the substrate 14.

Moreover, the semiconductor chip 16 may have a structure (for example, CSP, BGA or the like) where a semiconductor bare chip is mounted on an interposer having a plurality of electrode terminals land), and may be a circuit substrate. That is, it can be applied to not only the flip chip packaging but also a connection between substrates for electrically connecting electrodes of the substrates each of which has a plurality of the electrodes. The connection between the substrates can be achieved by a method described below.

Firstly, an electrode of a first substrate and an electrode of a second substrate are arranged in a state of facing each other and being held at a desired gap, the conductive resin composition of the present invention is supplied into a gap between the first substrate and the second substrate, and the first flowing medium containing the metal particles of the conductive resin composition is self-aggregated between the electrode of the first substrate and the electrode of the second substrate by an interfacial tension. Thereafter, the resin that is self-aggregated between the electrodes is cured.

As described above, the present invention has been explained by way of a preferred example, but the description above does not limit the present invention, and needless to say, it can be modified variously. For example, it is described that the conductive resin composition preferably has a viscosity having flowability at room temperature, but may have a viscosity that is decreased to be flowable by being heated.

The present invention provides a conductive resin composition that can applied to the flip chip packaging of the next-generation LSI, the flip chip packaging method with high productivity and high reliability, and the connection method between the substrates.

The invention may be embodied in other forms without departing from the spirit or essential characteristics thereof. The embodiments disclosed in this application are to be considered in all respects as illustrative and not limiting. The scope of the invention is indicated by the appended claims rather than by the foregoing description, and all changes which come within the meaning and range of equivalency of the claims are intended to be embraced therein.

What is claimed is:

1. A conductive resin composition for connecting electrodes electrically, in which metal particles are dispersed in a flowing medium,
    wherein the flowing medium comprises a first flowing medium that has relatively high wettability with the metal particles and a second flowing medium that has relatively low wettability with the metal particles, and
    the first flowing medium and the second flowing medium are dispersed in a state of being incompatible with each other.

2. The conductive resin composition according to claim 1, wherein the metal particles are dispersed in the first flowing medium and the second flowing medium when being mixed, the metal particles are dispersed in the first flowing medium in a stationary state, and the first flowing medium and the second flowing medium are in a state of being dispersed.

3. The conductive resin composition according to claim 1, wherein a surface tension of the first flowing medium is higher than a surface tension of the second flowing medium.

4. The conductive resin composition according to claim 1, wherein the first flowing medium is composed of a thermosetting resin, and
    the metal particles are made of a solder metal and have a melting point that is equal to or lower than a curing temperature of the thermosetting resin.

5. The conductive resin composition according to claim 1, wherein the first flowing medium is composed of a thermoplastic resin, and the second flowing medium is composed of a thermosetting resin.

6. The conductive resin composition according to claim 1, wherein the first flowing medium is composed of a thermosetting resin, and the second flowing medium is composed of a photocurable resin.

7. The conductive resin composition according to claim 1, wherein the first flowing medium or the second flowing medium is a liquid, and a solvent that can be solved in the first flowing medium or the second flowing medium is added.

8. The conductive resin composition according to claim 1, wherein the first flowing medium is oil, and the second flowing medium is water.

9. The conductive resin composition according to claim 1, wherein a content ratio of the metal fine particles, the first flowing medium and the second flowing medium is within ranges of:
    the metal particles: 4 wt % to 40 wt %;
    the first flowing medium: 10 wt % to 20 wt %; and
    the second flowing medium: 40 wt % to 76 wt %.

10. The conductive resin composition according to claim 1, wherein an average volume particle diameter of the metal fine particles ranges from 1 μm to 30 μm.

* * * * *